(12) United States Patent
Lin et al.

(10) Patent No.: US 10,739,672 B2
(45) Date of Patent: Aug. 11, 2020

(54) METHOD FOR PREPARING MASK, MASK AND EVAPORATION SYSTEM

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Zhiming Lin, Beijing (CN); Zhen Wang, Beijing (CN)

(73) Assignees: BOE TECHNOLOGY GROUP CO., LTD., Beijing (CN); ORDOS YUANSHENG OPTOELECTRONICS CO., LTD., Ordos, Innter Mongolia (CN)

( * ) Notice: Subject to any disclaimer, the term of this patent is extended or adjusted under 35 U.S.C. 154(b) by 235 days.

(21) Appl. No.: 15/798,753

(22) Filed: Oct. 31, 2017

(65) Prior Publication Data
US 2018/0196341 A1    Jul. 12, 2018

(30) Foreign Application Priority Data

Jan. 10, 2017 (CN) .......................... 2017 1 0015908

(51) Int. Cl.
| | | |
|---|---|---|
| *B23K 9/00* | (2006.01) | |
| *G03F 1/38* | (2012.01) | |
| *G03F 1/68* | (2012.01) | |
| *C23C 14/04* | (2006.01) | |
| *H01L 27/32* | (2006.01) | |
| *H01L 51/00* | (2006.01) | |

(52) U.S. Cl.
CPC .................. *G03F 1/38* (2013.01); *B23K 9/00* (2013.01); *C23C 14/042* (2013.01); *G03F 1/68* (2013.01); *H01L 27/3244* (2013.01); *H01L 51/0011* (2013.01)

(58) Field of Classification Search
CPC ..... G03F 1/38; G03F 1/68; G03F 1/00; C23C 14/042; C23C 14/04; H01L 51/0011; H01L 27/3244; H01L 51/56
USPC ............................. 228/141.1, 173.1, 173.6
See application file for complete search history.

(56) References Cited

U.S. PATENT DOCUMENTS

| | | | |
|---|---|---|---|
| 2002/0081933 A1* | 6/2002 | Wilbur, Jr. ......... | B23K 37/0443 445/30 |
| 2011/0220019 A1* | 9/2011 | Lee ...................... | C23C 14/042 118/504 |
| 2015/0014888 A1* | 1/2015 | Oh ..................... | B23K 37/0408 264/400 |

(Continued)

FOREIGN PATENT DOCUMENTS

JP          08103958 A   *   4/1996   ............. B29C 45/66

*Primary Examiner* — Kiley S Stoner
(74) *Attorney, Agent, or Firm* — Nath, Goldberg & Meyer; Joshua B. Goldberg; Stephanie F. Majkut

(57) ABSTRACT

A method of preparing a mask, a mask and an evaporation system are provided. The mask includes a frame having an opening in a middle region thereof and a mask pattern disposed above the frame. The method of preparing the mask includes: applying first opposite forces to the frame during a molding process of the frame; applying second opposite forces to the frame, during a welding process when the mask pattern is welded to at least part of the frame to cover an inner opening region of the frame; wherein the first opposite forces and the second opposite forces are equal in magnitude and the same in direction.

15 Claims, 6 Drawing Sheets

(56) References Cited

U.S. PATENT DOCUMENTS

| | | | |
|---|---|---|---|
| 2015/0026947 A1* | 1/2015 | Han | C23C 14/042 29/428 |
| 2015/0068023 A1* | 3/2015 | Han | H01L 51/56 29/592 |
| 2015/0068456 A1* | 3/2015 | Kuriyama | C23C 14/042 118/505 |
| 2016/0201185 A1* | 7/2016 | Bai | B23K 31/02 118/720 |

* cited by examiner

METHOD FOR PREPARING MASK, MASK AND EVAPORATION SYSTEM

CROSS-REFERENCE TO RELATED APPLICATIONS

The present application claims the priority of Chinese Patent Application No. 201710015908.3, filed on Jan. 10, 2017, the contents of which are incorporated herein in their entirety by reference.

TECHNICAL FIELD

The present disclosure relates to the field of display technology, and in particular, relates to a method for preparing a mask, a mask and an evaporation system.

BACKGROUND

With the development of science and technology, flat-panel display devices have been greatly developed, wherein a liquid crystal display (referred to as LCD for short) and an organic light-emitting diode (referred to as OLED for short) display are the most widely used ones.

In the preparation process of the OLED display, a fine metal mask (referred to as FMM for short) is used generally. In high-resolution display products, because the size of a pixel structure of the OLED display is very small, requirements on parameters of the FMM are very strict.

SUMMARY

The present disclosure provides a method of preparing a mask, a mask and an evaporation system.

A first aspect of the disclosure provides a method of preparing a mask, the mask including a frame having an opening in a middle region thereof and a mask pattern disposed above the frame, wherein the method includes:

applying first opposite forces to the frame during a molding process of the frame;

applying second opposite forces to the frame, during a welding process when the mask pattern is welded to at least part of the frame to cover an inner opening region of the frame;

wherein the first opposite forces and the second opposite forces are equal in magnitude and the same in direction.

Optionally, the mask pattern has a strip-shaped structure, the first opposite forces comprise a pair of opposite forces applied to opposite sides of the frame, and the second opposite forces comprise a pair of opposite forces applied to the opposite sides of the frame.

Optionally, a direction of applying the first opposite forces is the same as an arrangement direction of the strip-shaped structure; and a direction of applying the second opposite forces is the same as the arrangement direction of the strip-shaped structure.

Optionally, during the welding process, a plurality of strip-shaped structures are welded in parallel to a weld region of the frame at intervals, so that the strip-shaped structures cover the inner opening region of the frame.

Optionally, the mask pattern has a sheet-shaped structure comparable to the opening region of the frame, the first opposite forces include two pairs of opposite forces each pair applied to opposite sides of the frame, and the second opposite forces include two pairs of opposite forces each pair applied to the opposite sides of the frame.

Optionally, the two pairs of opposite forces of the first opposite forces are applied to four sides of the frame, and the two pairs of opposite forces of the second opposite forces are applied to the four sides of the frame.

Optionally, during the welding process, the mask pattern is welded to a weld region of the frame so that the sheet-shaped structure covers the inner opening region of the frame.

Optionally, each of the first opposite forces and the second opposite forces is in a range from 5 kgf to 110 kgf.

Optionally, the first opposite forces are applied to the frame by a mechanical force applying device.

Optionally, the mechanical force applying device includes a motor and a mechanical part, and the first opposite forces are applied to the frame by driving the mechanical part through a rotation of the motor.

A second aspect of the disclosure provides a mask including a frame and a mask pattern, wherein a contact area of the frame and mask pattern is flat, and flatness of the mask formed by welding the mask pattern on the frame is within ±10 to 30 μm.

A third aspect of the disclosure provides an evaporation system including the mask described above.

DETAILED DESCRIPTION

To make one of ordinary skill in the art better understand the technical solutions according to the present disclosure, a method for preparing a mask, a mask and an evaporation system according to the present disclosure will be further described in detail below with reference to the accompanying drawings and embodiments.

Figure 1A:
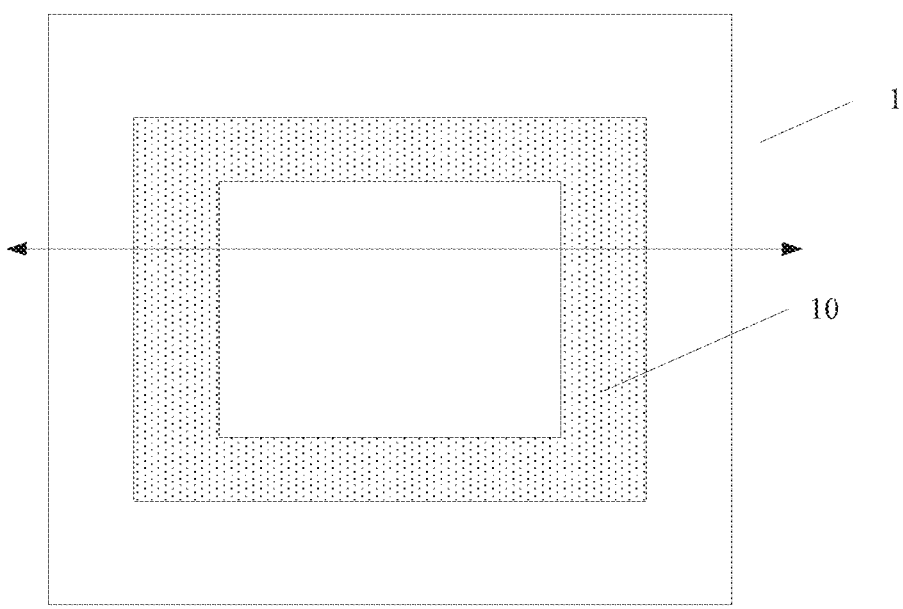
FIGS. 1A and 1B are a top view and a schematic cross-sectional view, respectively, of a mask frame according to an embodiment of the disclosure.
Figure 1B:

FIGS. 1A and 1B are a top view and a schematic cross-sectional view, respectively, of a mask frame according to an embodiment of the disclosure. FIG. 1A shows a frame 1, which has an opening in the central area thereof, i.e., the frame 1 has a hollow structure. A cross-section of the frame 1 taken along the arrow direction shown in FIG. 1A is of step shape, and a weld region 10 is a convex portion around an inner periphery of the frame 1. The overall width of the commonly used frame 1 (the distance between the innermost edge and the outermost edge of the frame 1) is about 100 mm, and the width of the weld region 10 (the width of each of the sides of the shadow rectangular ring as shown in FIG. 1A) is about 7 mm. The weld region 10 is used for welding a mask pattern and typically is an inner edge region of the frame 1. For ease of illustration, the weld region 10 is not specifically shown in other schematic diagrams except FIGS. 1A and 1B of the drawings. The term of welding means that a mask pattern is disposed on the frame 1 so that the lower surface of the mask pattern contacts with the upper surface of the weld region 10 of the frame 1, and both of them are fused together under the action of a laser to form a finished mask. In the finished mask, the mask pattern may cover all or a part of an inner opening region of the frame 1, which is not limited herein.

According to the method for preparing a mask of the present embodiment, a pre-deformation compensation is performed on the frame 1 during the molding process (for example, during a polishing process) thereof, the flatness of the frame 1 is improved significantly by changing process conditions of the frame 1 during the polishing process. For example, the pre-compensation principle of the present disclosure is described by way of example as follows. A metal part is set to operate at 80° C. If the ambient temperature is set to 80° C. during the production of the metal part, then in the working ambient temperature of 80° C. after the production, the metal parts are not substantially subject to additional deformation due to thermal expansion and are not affected by the temperature.

Figure 2A:
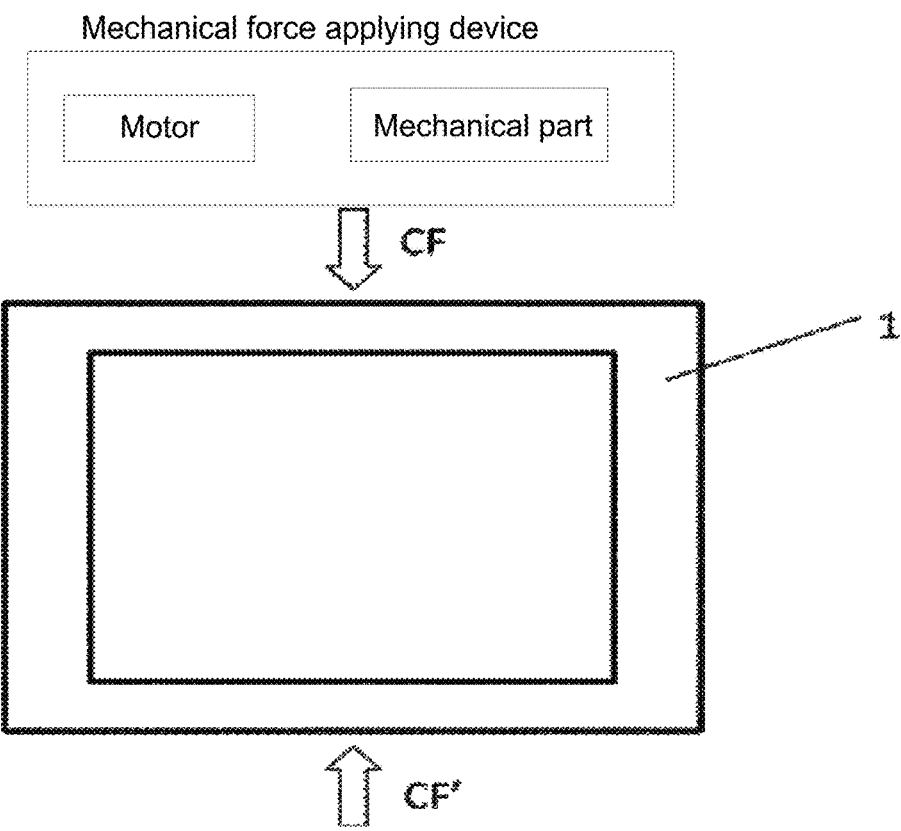
FIGS. 2A and 2B are schematic views for a frame molding process and a frame welding process in a preparation method of a mask according to an embodiment of the disclosure.
Figure 2B:
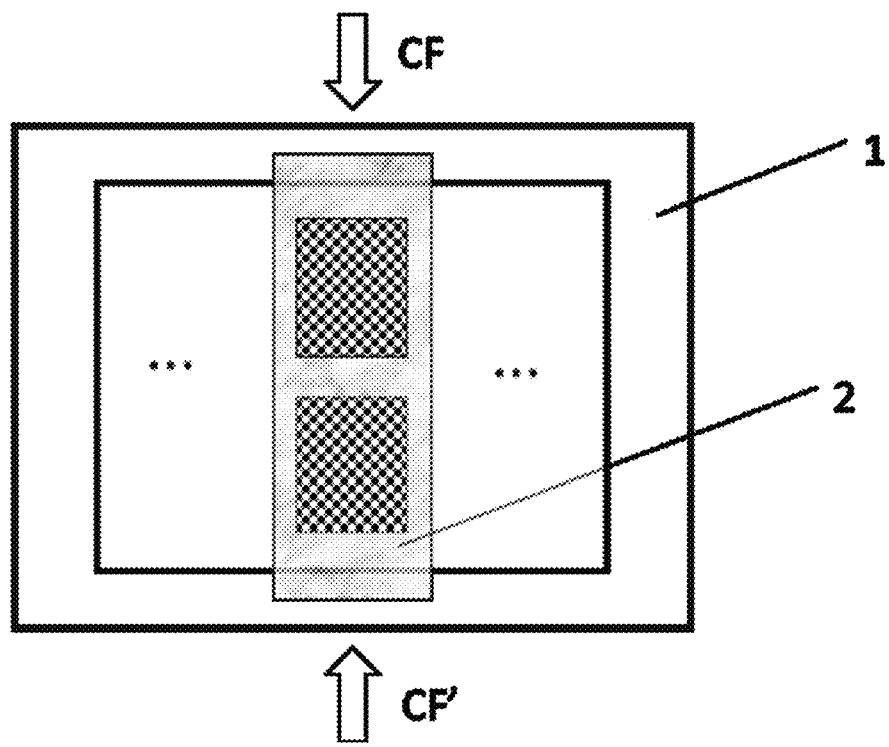

FIGS. 2A and 2B are schematic views for a frame molding process and a frame welding process in the preparation method of a mask according to an embodiment of the disclosure. As shown in FIG. 2B, the mask pattern 2 to be welded is a strip-shaped structure; alternatively, during a welding process, a plurality of strip-shaped structures are welded in parallel to the weld region of the frame 1 at intervals, so that strip-shaped structures cover the inner opening region of the frame 1.

During a molding process of the frame, first opposite forces CF and CF' are applied to the frame; the frame 1 expands outward when the first opposite forces CF and CF' are released, and outward expanding tendency keeps balance with inward stretch tendency of the mask pattern 2 on the frame 1. Accordingly, the direction of applying the first opposite forces CF and CF is inward, so that the direction of applying the opposite forces is opposite to the stretch direction of the strip-shaped mask pattern 2, for example, the direction of applying the opposite forces is an up-and-down direction as shown in FIGS. 2A and 2B.

As shown in FIG. 2B, the mask patter 2 needs to be stretched when welded to the frame 1, and the mask patter 2 is stretched by a clip before the mask patter 2 is welded, therefore the stretch direction of the mask patter 2 is outward at this time; after the mask pattern 2 is welded to the frame 1, the fixing function of the frame 1 is used for maintaining the stretch effect of the mask pattern 2, so the function of the mask pattern 2 on the frame 1 is inward stretch effect.

The frame 1 is generally manufactured by a manufacturer and a mask is formed by welding the appropriate mask pattern 2 onto the frame 1 according to the patter conditions during use. The reason why second opposite forces are applied when welding the mask pattern 2 to the frame 1 is that: the mask patter 2 needs to be stretched when welded to the frame 1 to ensure that an opening in an effective region of the mask pattern can reach a predetermined position through a process of stretch adjustment (the accurate pattern position ensures the subsequent accurate evaporation). In this way, after the mask patter 2 subjected to the stretch force is fixedly bonded to an upper surface of the frame 1 by a welding process, the frame 1 is deformed due to stretch function of the mask pattern 2 (the inward stretch effect). Therefore the mask patter 2 is in a relaxed state, and the previously adjusted state of the mask is damaged, which affects subsequent evaporation effect. In order to avoid this affect, in the mask preparation method of the present embodiment, the first opposite forces CF and CF' are applied during the polishing process of the frame 1, as shown in FIG. 2A, the magnitudes of the first opposite forces are equal to those of the second opposite forces used in the welding process and the directions of the first and second opposite forces are the same as well.

FIG. 2A shows a schematic view of applying the first opposite forces CF and CF' to the frame 1 during the polishing process in the preparation method of the mask. When the surface of the frame 1 is polished, a pair of the first opposite forces CF and CF' are applied to the frame 1, the magnitude of which are equal to that of the second opposite forces required for the site factory welding process.

As shown in FIG. 2B, the weld portion of the mask pattern 2 to be welded on the frame 1 can be regarded as a mask border. The second opposite forces CF and CF' are applied to the frame 1 when the border of the mask pattern 2 is welded above the weld region 10 of the frame 1. The first opposite forces and the second opposite forces are equal in magnitude and are the same in direction as well. In this way, when the mask pattern 2 is welded in the site welding process and the second opposite forces CF and CF are applied to the frame 1, the upper surface of the frame 1 becomes flat, which increases the welding success rate and the flatness of the finished mask, further improving the quality of the mask and reducing the defect rate. Herein, the flatness refers to a difference between a highest point and a lowest point of an object surface from a reference plane.

The stretch function and the directions and magnitude of opposite forces are further described as follows.

1) The stretch direction is outward when the mask pattern 2 is stretched;

2) After the mask pattern 2 is welded to the frame 1, the stretch effect of the mask pattern 2 on the frame 1 is inward;

3) When opposite forces are applied to the frame 1, the directions of opposite forces is inward; and 4) When the opposite forces are released from the frame 1, the change tendency of frame 1 is outward.

According to the present disclosure, the first opposite forces and the second opposite forces respectively include a pair of opposite forces CF and CF' applied to the opposite sides of the frame 1, the pair of opposite forces CF and CF' applied to the opposite sides of the frame 1 are equal in magnitude and opposite in direction. When the first opposite forces and the second opposite forces are applied to the opposite sides of the frame 1, respectively, the direction of applying opposite forces is the same as the arrangement direction of the strip-shaped structure of the mask pattern 2, that is, the points where the opposite forces are applied are at both ends of the mask pattern 2 with the strip-shaped structure.

In addition, the range of each of the first opposite forces and the second opposite forces is in the range from 5 kgf to 110 kgf, that is, the magnitude of each of the two opposite forces applied in pairs may be anyone in this range. In general, the pair of opposite forces applied to opposite sides are equal in magnitude, such a force magnitude range may ensure the accuracy of the mask pattern 2.

Accordingly, in the mask formed by the mask preparation method described above, the contact area of the frame 1 and mask pattern 2 is flat, and the flatness of the mask formed by welding the mask pattern on the frame is within ±10 to 30 μm, that is, better flatness of the mask is obtained.

According to an exemplary embodiment of the present disclosure, in the case where the second opposite forces are applied to the frame 1 during the welding process, the upper surface is not flat and the four corners go upward, resulting in gap between the frame 1 and the mask pattern 2 after they contact each other during the welding process, which results in an untight contact, thus affecting the welding process of welding the mask pattern 2 onto the frame 1. Since the mask pattern 2 is stretched in the up-and-down direction, when a pair of first opposite forces are applied to the frame 1 (in the up-and-down direction) during the polishing process, the frame 1 is deformed towards the middle thereof by the pair of first opposite forces. After the first opposite forces are released, the frame 1 has an outward expanding tendency, this expanding tendency can counteract the previously inward stretch effect of mask pattern 2 itself on the frame 1, so as to achieve the effect that the frame 1 is not deformed (the mask pattern 2 before welding is compared with the mask pattern 2 after welding). In this way, the mask pattern 2 welded to the frame 1 is not relaxed, and the position accuracy of the opening region in the effective region can be ensured without affecting subsequent evaporation effect.

The application of the first opposite forces may employ a mechanical device. A metal part on the outside border of the frame 1 is squeezed by driving a mechanical part through the rotation of a motor. A forcemeter is used for measuring the value of the opposite forces in the squeezing process, and thus the magnitude of the first opposite forces is under control.

Figure 3:
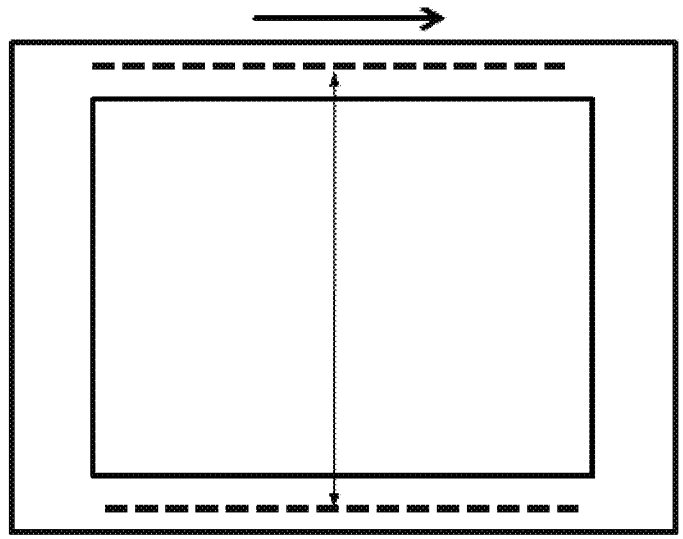
FIG. 3 is a schematic view of a flatness measurement direction of a mask according to an embodiment of the disclosure.
Figure 4:
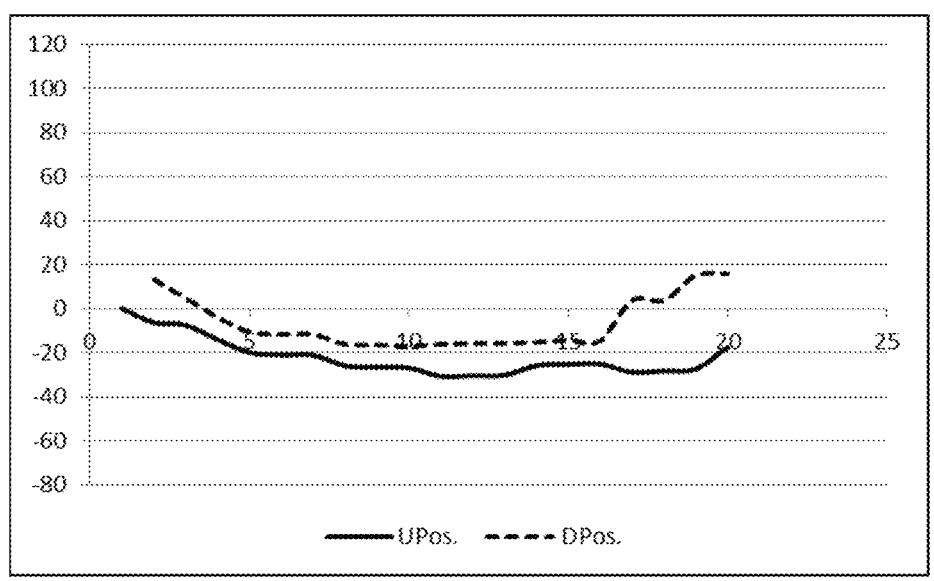
FIG. 4 is a schematic view of a flatness test result of a mask according to an embodiment of the disclosure.

After all the mask patterns 2 are welded, the flatness of the mask is monitored. According to the schematic view of the flatness test direction of the mask in FIG. 3, the flatness data of the two weld surface positions at two opposite sides of the weld region 10 where each of the mask patterns 2 is welded to the frame 1 are read along the measurement path to form a flatness curve. The flatness data in weld region on each of the two opposite side is connected to form a curve and the resultant curves are marked with U Pos (Up Position) and D Pos (Down Position), respectively. A flatness test is performed on the mask obtained by the mask preparation method in the present embodiment. The flatness data obtained is shown in FIG. 4, and compared with the flatness data of the mask obtained by using the mask preparation process in prior art as shown in FIG. 5 (the ordinates in FIGS. 4 and 5 in unit of μm).

Figure 5:
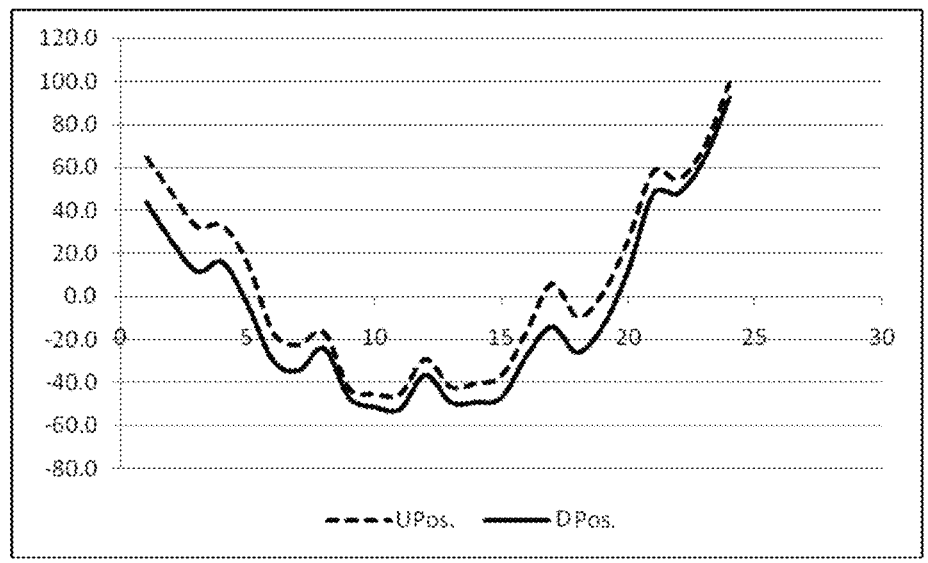
FIG. 5 is a schematic view of a flatness test result of mask in prior art.

Taking a process of preparing a mask in certain size for example, in FIG. 5, in the molding process of the frame 1 in the first step, the control is performed according to the flatness of ±30 μm. In the finished mask obtained by the site welding process, the surface position of the weld region 10 has flatness about 150 μm, this is because the opposite forces are applied to the frame 1 in the site welding process, resulting in a state in which the four corners of the frame 1 go upward, resulting in flatness deterioration; and in FIG. 4, the same opposite forces as in the welding process are applied in the molding process of the frame 1 in the first step, and the flatness (of effective region position) the finished mask after being site welded is in the range of ±30 μm. It can be seen that the method of preparing a mask according to the present embodiment enables smaller flatness data of the mask, so that the flatness of the mask is significantly improved.

Figure 6:
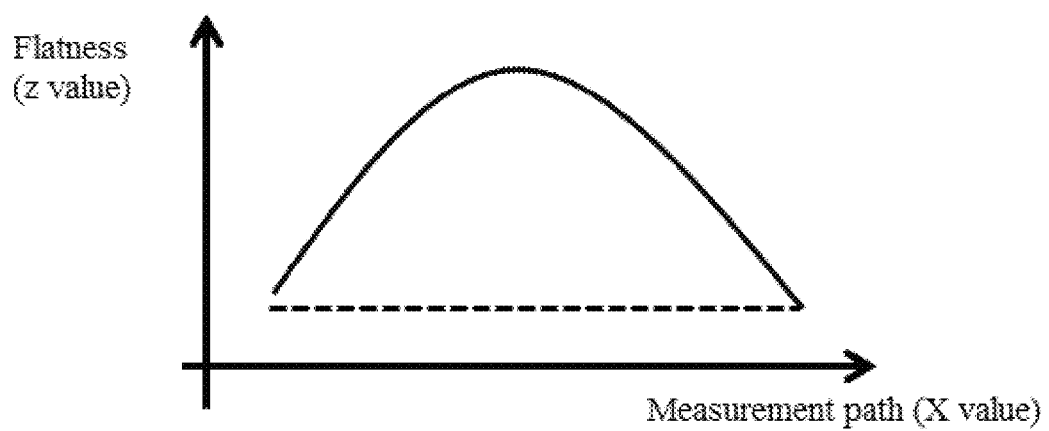
FIG. 6 is a graph showing the relationship between opposite forces and flatness in the preparation method of the mask according to an embodiment of the disclosure.

In the mask obtained by the method for preparing the mask of the present embodiment, the relationship between the first opposite forces applied to the frame 1 in the molding process of the flame 1 and the flatness of the surface of the weld region 10 is shown in FIG. 6. It can be seen that, opposite forces with an appropriate magnitude may be selected to produce a mask with better flatness.

In the method of preparing the mask in the present embodiment, when the frame deformation is constant, the accuracy of the opening region of the mask patter 2 welded to the frame 1 is not changed, so that the balance effect of the forces can be transferred to balance of the frame 1 applied with the forces, which realizes the force balance, and deformation amount remains unchanged to ensure that the accuracy of the mask is unchanged.

It can be seen that according to the preparation method of the mask in this embodiment, the upper surface of the frame 1 becomes flat by applying first opposite forces to the frame in the frame molding process and applying second opposite forces when the mask pattern is welded in the welding process, which can effectively improve the success rate of welding, improve the flatness of the mask, ensure the accuracy of the mask pattern, and reduce the defect rate.

An exemplary embodiment of the present disclosure discloses a method of preparing a mask, which can effectively improve the flatness of a weld region of each of a frame and a mask pattern during the preparation of the mask, and improve the quality of the mask.

The method of preparing a mask according to the present embodiment is different from the above embodiment in that the shape of the mask pattern 2 welded onto the weld region 10 of the frame 1 is different, and furthermore, the amount, magnitude and directions of the opposite forces applied to the frame 1 in the molding process of the frame 1 (e.g., a polishing process) are different.

Figure 7A:
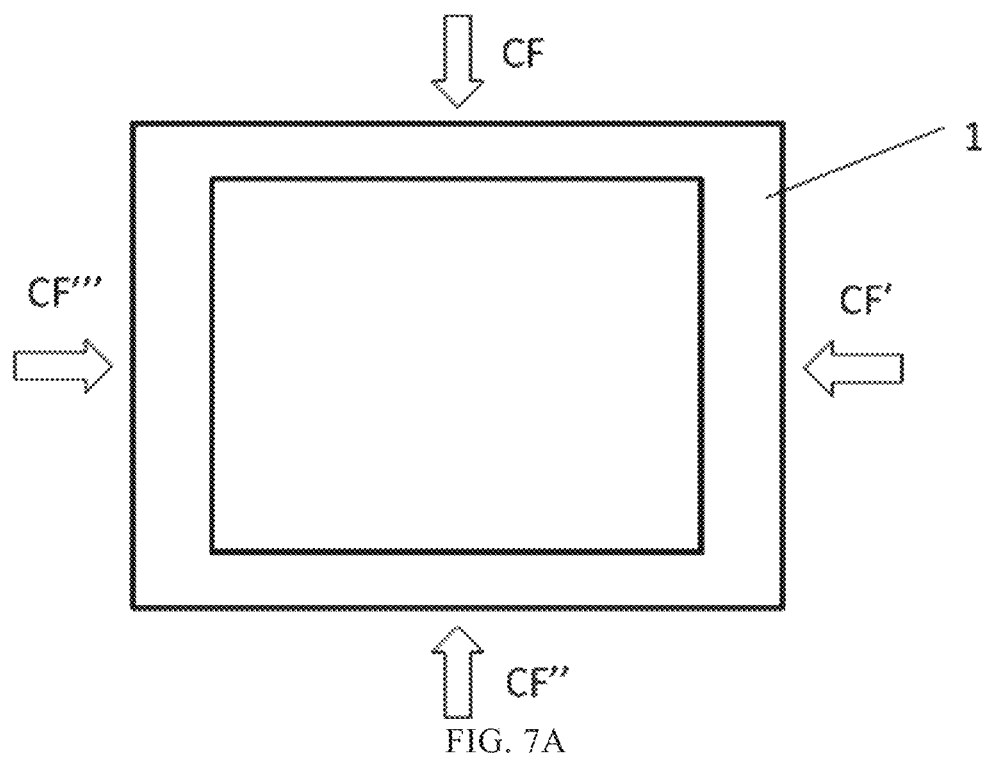
FIGS. 7A and 7B are schematic views for a frame molding process and a frame welding process in the preparation method of the mask according to an embodiment of the disclosure.
Figure 7B:
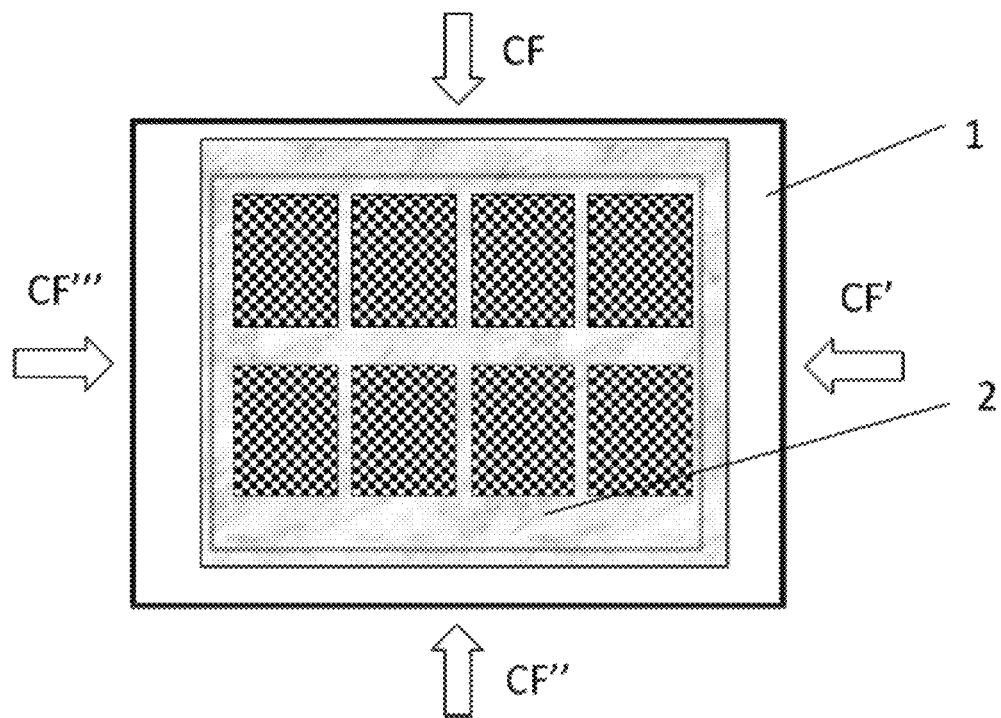

FIG. 7A shows a schematic diagram of applying first opposite forces to the frame 1 during a polishing process in the preparation method of the mask; and FIG. 7B shows that the mask pattern 2 is welded during a site welding process and applied with second opposite forces. The first opposite forces and the second opposite forces are equal in magnitude and the same in direction, the functions of the two counteract each other. Therefore, the upper surface of the frame 1 becomes flat, which improves the welding success rate, improves the flatness of the finished mask, further improves the quality of the mask, and reduces the defect rate.

In the mask according to the present embodiment, the mask pattern 2 is a sheet-shaped structure comparable to the opening region of the frame 1. In the method of preparing the mask, the first opposite forces and the second opposite forces respectively include two pairs of opposite forces CF, CF'' and CF', CF''' each pair applied to two opposite sides. According to the structure of mask 2, the opposite forces shown in FIGS. 7A and 7B are applied, so that the flatness of the frame 1 is significantly improved.

As shown in FIGS. 7A and 7B, the first opposite forces and the second opposite forces are applied to four sides of the frame 1, respectively. According to the shape and structure of the mask pattern 2, the direction of applied opposite forces is appropriately designed, so that the flatness of the frame 1 can be improved.

During the welding process, the mask pattern 2 is welded to the weld region 10 of the frame 1, and the sheet-shaped structure of the mask pattern 2 covers the inner opening region of the frame 1. According to the structure of the mask pattern 2, a position of the mask pattern 2 in the frame 1 is defined to ensure the accuracy of the mask pattern 2.

Figure 8:
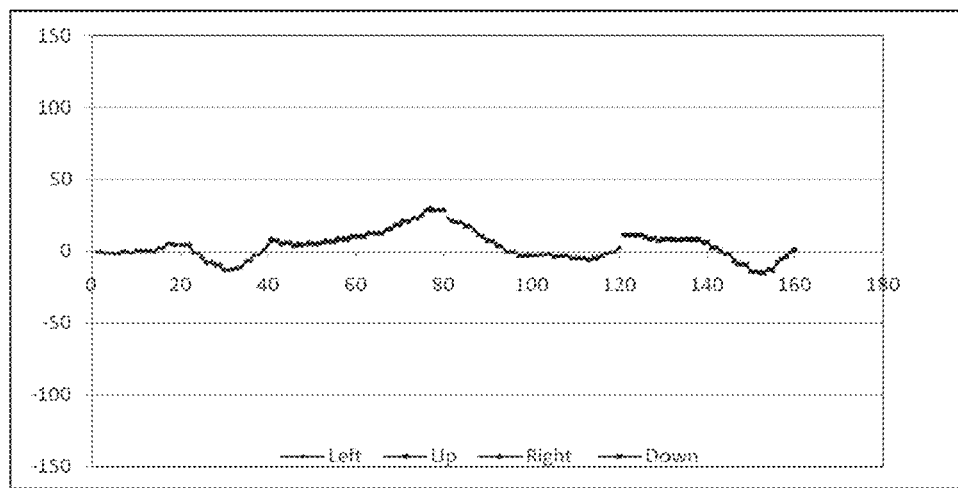
FIG. 8 is a schematic view showing a flatness test result of a mask according to an embodiment of the disclosure.

When the mask pattern 2 is stretched either up and down or left and right (i.e., including stretch in the up-and-down direction and stretch in the left-and-right direction) in the welding process, since the mask pattern 2 is synthetically stretched both in up-and-down direction and in left-and-right direction, the preparation method of the mask according to the present embodiment needs to apply the first opposite forces both in up-and-down direction and in left-and-right direction of the frame 1 during the polishing process of the frame 1. The flatness curve of the mask under test in each direction is shown in FIG. 8, the curve includes four directions which are left, up, right and down.

In the preparation method of the mask, the first opposite forces are applied to the frame 1 when the upper surface of the frame 1 is polished to trim the flatness. After the polishment on the upper surface of the frame 1 is complete, the upper surface of the frame 1 is in a protruding state; and then the second opposite forces are applied by the mask pattern 2 welded above the flame 1 in the site welding process, the effect of the second opposite forces on the frame 1 is to make four corners upward, that is, a concave state. Because the first opposite forces and the second opposite forces are equal in magnitude and the same in direction, the concave state counteracts the previous protruding state of the frame 1 to reach a state that mask is in a flat state as a whole, making the upper surface of the frame flat, which can effectively improve the success rate of welding, and improve the flatness of the mask.

The exemplary embodiments of the present disclosure are not limited to the above-described embodiments, but may be modified as appropriate without departing from the scope of the present disclosure.

In general, the mask pattern 2 may have different shapes and structures, and the position of the mask pattern 2 in the frame 1 may be defined according to the shapes and structures of the mask pattern 2, and the applied forces may be designed appropriately so that the first opposite forces in the polishing process and the second opposite forces in the welding process are equal in magnitude and the same in direction, so as to improve the flatness of the mask significantly, and improve the flatness of the frame 1 as well.

It is easy to understood that a first force applied to the frame 1 in the molding process of the frame 1 may be the resultant force of the second opposite forces applied to the frame 1 when a plurality of mask patterns 2 are welded to the frame 1 (e.g., for special-shaped mask obtained through the combination of two or more mask patterns, such as a mask having watch-shaped in which the mask pattern has a circular border and a plurality of square borders are disposed thereon). However, only the first force is collectively referred to in the variation of the present disclosure, but the resultant force is not limited herein.

In the method of preparing a mask according to one or more of the embodiments described above, by applying the first opposite forces to the frame during the frame molding process, and applying the second opposite forces when welding the mask pattern over the frame in the welding process, the surface flatness becomes better, the welding success rate is effectively improved, and the flatness of the mask is improved, which ensure the accuracy of the mask pattern, and reduce the defect rate.

An embodiment of the present disclosure provides an evaporation system including the mask prepared in accordance with one or more embodiments described above, and the evaporation system is capable of obtaining a higher accurate mask pattern.

In the evaporation system, an evaporation source is provided at the bottom thereof, and the mask pattern is fixed to the frame and applied to the evaporation system. Evaporation material molecules are shielded by the mask or allowed to pass through, so that a substrate above the mask is prepared to have a predetermined pattern.

Because the mask used has a higher flatness, a substrate prepared by the evaporation system has higher accurate pattern, and finished display products have higher yield.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and spirit of the present disclosure, which are also to be regarded as the scope of the present disclosure.

What is claimed is:

1. A method of preparing a mask, the mask comprising a frame having an opening in a middle region thereof and a mask pattern disposed above the frame, the method comprising:
    applying first opposite forces to the frame during a polishing process of the frame;
    applying second opposite forces to the frame, during a welding process when the mask pattern is welded to at least part of the frame to cover an inner opening region of the frame;
    wherein the first opposite forces and the second opposite forces are equal in magnitude and the same in direction.

2. The method of preparing the mask according to claim 1, wherein the mask pattern has a strip-shaped structure, the first opposite forces include a pair of opposite forces applied to opposite sides of the frame, and the second opposite forces include a pair of opposite forces applied to the opposite sides of the frame.

3. The method of preparing the mask according to claim 2, wherein a direction of applying the first opposite forces is the same as an arrangement direction of the strip-shaped structure; and a direction of applying the second opposite forces is the same as the arrangement direction of the strip-shaped structure.

4. The method of preparing the mask according to claim 2, wherein during the welding process, a plurality of strip-shaped structures are welded in parallel to a weld region of the frame at intervals, so that the strip-shaped structures cover the inner opening region of the frame.

5. The method of preparing the mask according to claim 1, wherein the mask pattern has a sheet-shaped structure comparable to the opening region of the frame, the first opposite forces include two pairs of opposite forces each pair applied to opposite sides of the frame, and the second opposite forces include two pairs of opposite forces each pair applied to the opposite sides of the frame.

6. The method of preparing the mask according to claim 5, wherein the two pairs of opposite forces of the first opposite forces are applied to four sides of the frame, and the two pairs of opposite forces of the second opposite forces are applied to the four sides of the frame.

7. The method of preparing the mask according to claim 5, wherein during the welding process, the mask pattern is welded to a weld region of the frame so that the sheet-shaped structure covers the inner opening region of the frame.

8. The method of preparing the mask according to claim 2, wherein each of the first opposite forces and the second opposite forces is in a range from 5 kgf to 110 kgf.

9. The method of preparing the mask according to claim 3, wherein each of the first opposite forces and the second opposite forces is in a range from 5 kgf to 110 kgf.

10. The method of preparing the mask according to claim 4, wherein each of the first opposite forces and the second opposite forces is in a range from 5 kgf to 110 kgf.

11. The method of preparing the mask according to claim 5, wherein each of the first opposite forces and the second opposite forces is in a range from 5 kgf to 110 kgf.

12. The method of preparing the mask according to claim 6, wherein each of the first opposite forces and the second opposite forces is in a range from 5 kgf to 110 kgf.

13. The method of preparing the mask according to claim 7, wherein each of the first opposite forces and the second opposite forces is in a range from 5 kgf to 110 kgf.

14. The method of preparing the mask according to claim 1, wherein the first opposite forces are applied to the frame by a mechanical force applying device.

15. The method of preparing the mask according to claim 14, wherein the mechanical force applying device includes a motor and a mechanical part, and the first opposite forces are applied to the frame by driving the mechanical part through a rotation of the motor.

* * * * *